United States Patent
Akiyama

(10) Patent No.: US 8,546,245 B2
(45) Date of Patent: Oct. 1, 2013

(54) METHOD FOR MANUFACTURING COMPOSITE SUBSTRATE COMPRISING WIDE BANDGAP SEMICONDUCTOR LAYER

(75) Inventor: Shoji Akiyama, Annaka (JP)

(73) Assignee: Shin-Etsu Chemical Co., Ltd. (JP)

( * ) Notice: Subject to any disclaimer, the term of this patent is extended or adjusted under 35 U.S.C. 154(b) by 79 days.

(21) Appl. No.: 13/130,627

(22) PCT Filed: Dec. 10, 2009

(86) PCT No.: PCT/JP2009/070656
§ 371 (c)(1),
(2), (4) Date: May 23, 2011

(87) PCT Pub. No.: WO2010/067835
PCT Pub. Date: Jun. 17, 2010

(65) Prior Publication Data
US 2011/0227068 A1    Sep. 22, 2011

(30) Foreign Application Priority Data

Dec. 11, 2008  (JP) .................................. 2008-315566
Dec. 8, 2009   (JP) .................................. 2009-278561

(51) Int. Cl.
*H01L 21/30*    (2006.01)

(52) U.S. Cl.
USPC .................... 438/459; 438/520; 257/E21.127

(58) Field of Classification Search
USPC .................................................. 438/45, 520
See application file for complete search history.

(56) References Cited

U.S. PATENT DOCUMENTS 6,071,795 A     6/2000 Cheung et al.
6,562,127 B1 *  5/2003 Kud et al. ................ 438/458

(Continued)

FOREIGN PATENT DOCUMENTS

EP    1482548 A1   12/2004
EP    1986218 A1   10/2008

(Continued)

OTHER PUBLICATIONS

Extended European Search Report corresponding to European Application No. 09831939.5 dated Jun. 8, 2012.

(Continued)

*Primary Examiner* — Chandra Chaudhari
(74) *Attorney, Agent, or Firm* — Myers Bigel Sibley & Sajovec, P.A.

(57) ABSTRACT

Provided is a method for manufacturing a low-cost bonded wafer (8) which allows bulk crystals of a wide bandgap semiconductor (1) to be transferred onto a handle substrate (3) as thinly as possible without breaking the substrate. More specifically, provided is a method for manufacturing a bonded wafer (8) by forming a wide bandgap semiconductor film (4) on a surface of a handle substrate (3), the method comprising a step of implanting ions from a surface (5) of a wide bandgap semiconductor substrate (1) having a bandgap of 2.8 eV or more to form an ion-implanted layer (2), a step of applying a surface activation treatment to at least one of the surface of the handle substrate (3) and the ion-implanted surface (5) of the wide bandgap semiconductor substrate (1), a step of bonding the surface (5) of the wide bandgap semiconductor substrate (1) and the surface of the handle substrate (3) to obtain bonded substrates (6), a step of applying a heat treatment to the bonded substrates (6) at a temperature of 150° C. or more and 400° C. less, and a step of subjecting the ion-implanted layer (2) of the wide bandgap semiconductor substrate (1) to irradiation of visible light from the semiconductor substrate (1) side of the bonded substrates (6) to embrittle an interface of the ion-implanted layer (2) and transfer the wide bandgap semiconductor film (4) onto the handle substrate (3).

20 Claims, 2 Drawing Sheets

(56) References Cited

U.S. PATENT DOCUMENTS

| | | | |
|---|---|---|---|
| 6,867,067 B2 * | 3/2005 | Ghyselen et al. | 438/458 |
| 2009/0111279 A1 | 4/2009 | Sakashita | |

FOREIGN PATENT DOCUMENTS

| | | |
|---|---|---|
| JP | 2002-033465 | 1/2002 |
| JP | 2004-140266 | 5/2004 |
| JP | 2005-252244 | 9/2005 |
| JP | 2007-019482 | 1/2007 |
| JP | 2008-277552 | 11/2008 |
| JP | 2009-027206 | 2/2009 |
| WO | WO 2006/082467 A1 | 8/2006 |

OTHER PUBLICATIONS

International Search Report corresponding to International Application No. PCT/JP2009/070656 mailed Mar. 9, 2010.

Seager et al. "Infrared and transmission electron microscopy studies of ion-implanted H in GaN", *J. Applied Physics* 85(5):2568-2573 (1999).

Examination Report corresponding to European Application No. 09831939.5 dated Feb. 21, 2013.

\* cited by examiner

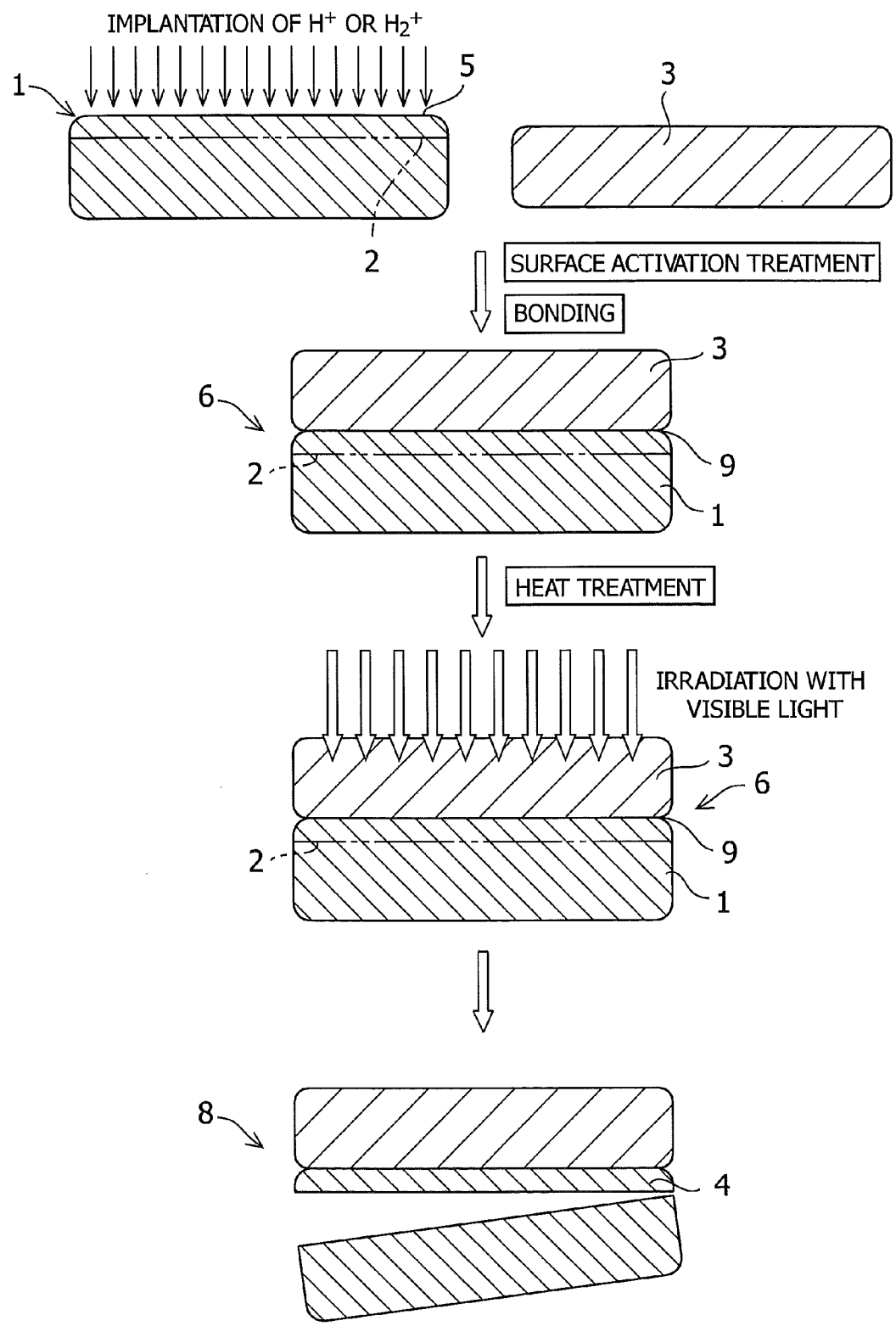

METHOD FOR MANUFACTURING COMPOSITE SUBSTRATE COMPRISING WIDE BANDGAP SEMICONDUCTOR LAYER

RELATED APPLICATIONS

This application is a 35 U.S.C. §371 national stage application of PCT Application No. PCT/JP2009/070656, filed on Dec. 10, 2009, which claims priority from Japanese Application No. 2009-278561 filed Dec. 8, 2009 and Japanese Application No. 2008-315566 filed Dec. 11, 2008, the contents of which are incorporated herein by reference in their entireties. The above-referenced PCT International Application was published as International Publication No. WO 2010/067835 A1 on Jun. 17, 2010.

TECHNICAL FIELD

The present invention relates to a method for manufacturing a composite substrate comprising a wide bandgap semiconductor layer.

BACKGROUND ART

As substrates for power semiconductors and short wavelength lasers, wide bandgap semiconductors have been receiving attention in recent years. In particular, silicon carbide SiC (2.9 eV to 3.0 eV), gallium nitride GaN (3.4 eV), zinc oxide ZnO (3.37 eV), diamond (5.47 eV), aluminum nitride AlN (6.0 eV) and the like, are materials particularly attracting attention, because of their high bandgaps.

However, while GaN is deposited by heteroepitaxial growth on single crystalline sapphire or single crystalline SiC as an example, the deposited GaN has a lot of defects due to a difference in lattice constant, and it is now difficult to apply the GaN to power semiconductor, high-performance lasers, etc.

Among methods for producing these single crystals, a method for producing the best quality crystal is a crystal growth method such as a hydrothermal synthesis method, and a piece (wafer) cut out of bulk crystals produced in accordance with this method is known to have the best quality. However, the crystal growth takes time, and the crystal is therefore priced extremely high, and now has failed to have a wide range of application. However, a section for actual use as a device is a limited region of several hundreds nm to several μm from the surficial layer so that a method of transferring the bulk crystals thinly onto a handle substrate to reduce cost can be said to be a natural idea.

As a typical method for film transfer, a SOITEC method can be cited, and in this method, a semiconductor film is transferred onto a handle substrate in such a way that a semiconductor substrate (donor substrate) subjected to hydrogen ion implantation in advance at room temperature and a substrate (handle substrate) to serve as a supporting substrate are bonded to each other, and subjected to a heat treatment at a high temperature (around 500° C.) to generate a large number of minute air bubbles referred to as microcavities and carry out detachment.

However, in practice, due to a difference in coefficient of thermal expansion between the donor substrate and the handle substrate (for example, silicon, quartz, sapphire, etc.), it is to be anticipated that simply bonding the both substrates and raising the temperature will cause the substrates to be cracked, thereby failing to form the composite substrate.

As another method, there is a method referred to as a SiGen method, which refers to a method in which a surface of a semiconductor substrate likewise subjected in advance to hydrogen ion implantation and/or a surface of a handle substrate is subjected to a plasma treatment to activate the surface or surfaces, and then bonded to each other, and a mechanical impact is applied to the substrates to carry out detachment at the hydrogen ion-implanted interface. However, the film transfer relies on a mechanical method (an impact or the like) so that there is a problem that the substrate is destroyed during the transfer of film from the thin semiconductor substrate with a small diameter due to the insufficient mechanical strength of the substrate.

DISCLOSURE OF THE INVENTION

Problem to be Solved by the Invention

An object of the present invention is to provide a method for manufacturing a low-cost bonded wafer which allows bulk crystals of a wide bandgap semiconductor to be transferred onto a handle substrate as thinly as possible without breaking the substrate.

Means for Solving the Problem

In order to solve the problem, the inventor has devised the following manufacturing method.

More specifically, as the method for manufacturing a bonded wafer according to the present invention, provided is a method for manufacturing a bonded wafer by forming a wide bandgap semiconductor film on a surface of a handle substrate, the method comprising a step of implanting ions from a surface of a wide bandgap semiconductor substrate having a bandgap of 2.8 eV or more to form an ion-implanted layer, a step of applying a surface activation treatment to at least one of the surface of the handle substrate and the ion-implanted surface of the wide bandgap semiconductor substrate, a step of bonding the surface of the wide bandgap semiconductor substrate and the surface of the handle substrate to obtain the bonded substrates, a step of applying a heat treatment to the bonded substrates at a temperature of 150° C. or more and 400° C. less, and a step of subjecting the ion-implanted layer of the wide bandgap semiconductor substrate to irradiation of visible light from the semiconductor substrate side or the handle substrate side of the bonded substrates to embrittle an interface of the ion-implanted layer and transfer the wide bandgap semiconductor film onto the handle substrate.

Effect of the Invention

The present invention allows the interface of the ion-implanted layer formed in the wide bandgap semiconductor substrate to be subjected to effective and efficient embrittlement without depending on a mechanical impact, and allows bulk crystals of the wide bandgap semiconductor to be transferred onto a handle substrate as thinly as possible, and thus allows the cost to be reduced. In addition, the present invention can also prevent the crack or chip of the bonded wafer, detachment at the bonded surfaces etc. from being caused by a difference in coefficient of thermal expansion between the wide bandgap semiconductor substrate and the handle substrate.

BRIEF EXPLANATION OF DRAWINGS

FIG. 2 is a diagram illustrating another embodiment of a method for manufacturing a bonded wafer according to the present invention.

Figure 1:
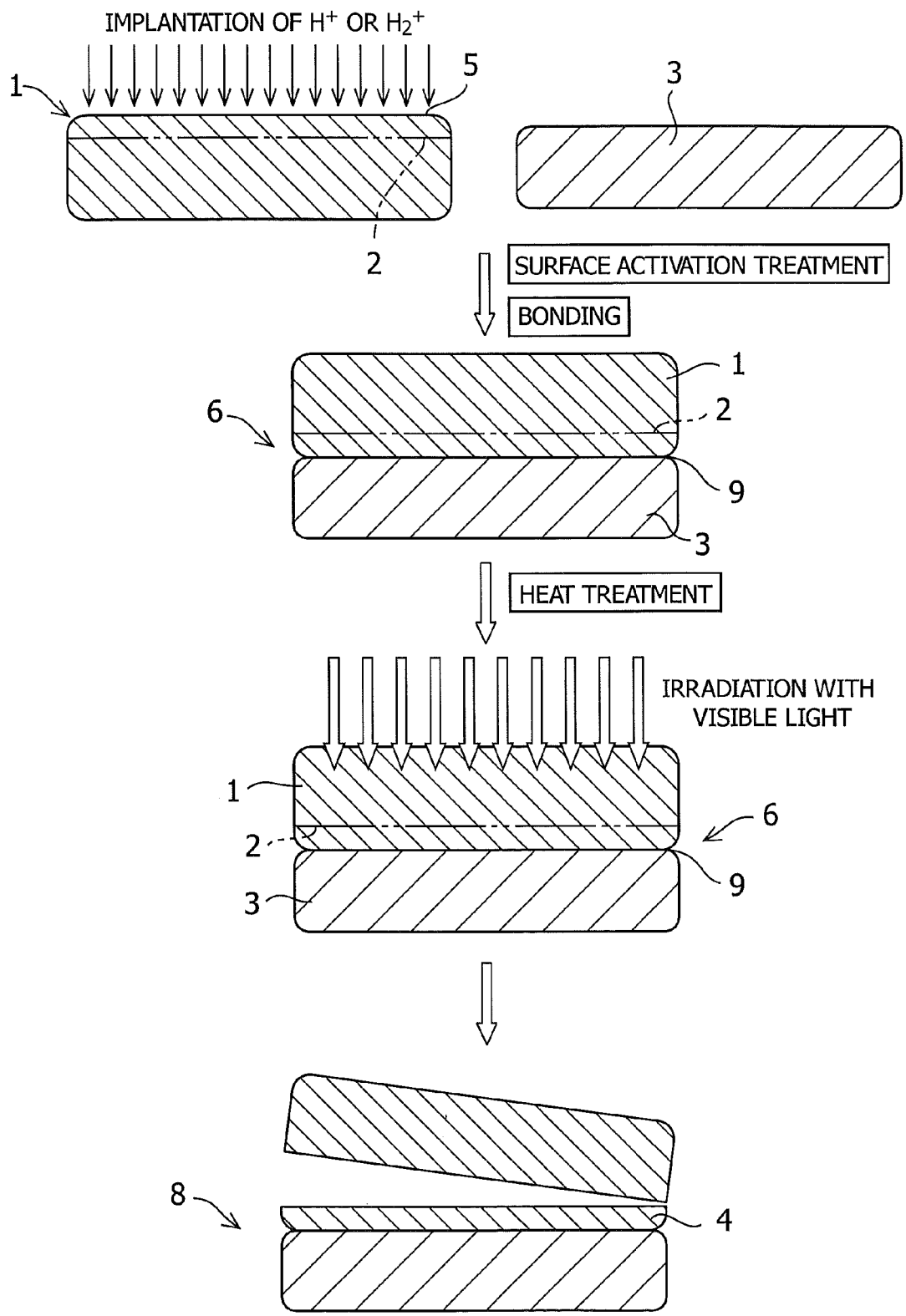
FIG. 1 is a diagram illustrating an embodiment of a method for manufacturing a bonded wafer according to the present invention.

DESCRIPTION OF REFERENCE SYMBOLS 1 wide bandgap semiconductor substrate
2 ion-implanted interface
3 handle substrate
4 wide bandgap semiconductor film
5 ion-implanted surface (ion implantation surface)
6 bonded substrates
8 bonded wafer
9 bonded surfaces

BEST MODE FOR CARRYING OUT THE INVENTION

The present invention is directed to a method for manufacturing a bonded wafer by forming a wide bandgap semiconductor film on the surface of a handle substrate.

The wide bandgap semiconductor substrate adopted in the present invention is known to be transparent to or have a transmission of 70% or more for light over an entire wavelength region of visible light (450 nm to 700 nm) or at least light in a longer wavelength region of visible light, because of its wide bandgap. Examples of the wide bandgap semiconductor include, but not limited to, for example, silicon carbide (SiC), gallium nitride (GaN), zinc oxide (ZnO), diamond and aluminum nitride (AlN), and semiconductors with a bandgap of 2.8 eV or more can be applied. The reason is that because of the absorption edge for 2.8 eV about 450 nm<absorption edge wavelength=1.24/bandgap (eV) μm>, light in a longer wavelength range than the absorption edge wavelength is less likely to be absorbed. The upper limit of the bandgap can be, for example, 6.5 eV as a measure above which the property as a semiconductor is lost and the insulating property increases.

The bandgap refers to the forbidden band width of a pure semiconductor, which is a value without consideration of an impurity level formed by incorporation of an impurity. In this specification, the value of the bandgap is obtained by converting the wavelength at the absorption edge into energy.

In the present invention, the wide bandgap semiconductor substrate may have a diameter of 25 mm to 100 mm. The thickness of the wide bandgap semiconductor substrate is not particularly limited. However, normal thin wafers of 1 mm or less, close to SEMI/JEIDA standards, are easy to handle.

The handle substrate is not particularly limited as long as the handle substrate can support the wide bandgap semiconductor film described above, and examples of the handle substrate include substrates of silicon, silicon having an oxide film formed thereon, alumina, non-single crystalline aluminum nitride, silicon carbide, glass, quartz, and sapphire.

In a visible light irradiation step to be described later, when the visible light irradiation is carried out from the handle substrate side, it is desirable that the handle substrate exhibits less energy loss in the wavelength region of visible light for irradiation, and the handle substrate is not particularly limited as long as the substrate exhibits a transmission of 70% or more in the visible light region mentioned above. However, above all, the handle substrate is preferably a substrate of any of glass, quartz, and sapphire which are excellent in terms of insulation and transparency. In the present invention, the wide bandgap semiconductor substrate typically has a diameter of 25 mm to 100 mm. The thickness of the wide bandgap semiconductor substrate is not particularly limited. However, normal thin wafers of 1 mm or less, close to SEMI/JEIDA standards, are easy to handle.

As shown in FIGS. 1 and 2, ions are first implanted from a surface 5 of a wide bandgap semiconductor substrate 1 to form an ion-implanted layer 2, then after respective surfaces to be bonded are subjected to a surface activation treatment, the surface 5 of the wide bandgap semiconductor substrate and the handle substrate 3 are bonded to each other to obtain the bonded substrates 6. The ion implantation will be described in detail later.

After the wide bandgap semiconductor substrate has the ion-implanted layer formed, it may have an $SiO_2$ film formed thereon with a thickness of approximately 50 nm.

In that case, an advantage of increase in bonding strength is obtained in the bonding step.

A method for the surface activation treatment may include an ozone water treatment, a UV ozone treatment, an ion beam treatment, and a plasma treatment. Although the mechanism of increase in bonding force due to the surface activation has not been completely figured out, the mechanism can be described as follows. In the case of an ozone water treatment or a UV ozone treatment, the activation is carried out in such a way that organic matter on the surface is decomposed by ozone to increase OH groups at the surface. On the other hand, in the case of an ion beam treatment or a plasma treatment, the activation is carried out by exposing highly reactive dangling bonds at the wafer surface, or adding OH groups to the dangling bonds. For the confirmation of the surface activation, the degree of hydrophilicity (wettability) can be measured.

Specifically, the measurement can be made simply by dropping water onto the wafer surface and measuring the contact angle.

In the case of a treatment with ozone water, the surface activation can be achieved by immersing the wafer in pure water with ozone dissolved about 10 mg/L.

In the case of a treatment with UV ozone, it is possible to carry out the surface activation by subjecting an ozone gas or an ozone gas generated from the air to UV light irradiation (e.g., 185 nm).

In the case of a treatment with ion beams, it is possible to increase the bonding force in such a way that the wafer surface is treated with beams from an inert gas such as argon under high vacuum as in sputtering to expose dangling bonds at the surface.

In the case of a plasma treatment, the surface can be subjected to the plasma treatment by placing the wide bandgap semiconductor substrate and/or the handle substrate in a chamber, introducing a plasma gas under reduced pressure, and then exposing the substrate(s) to a high-frequency plasma about 100 W for about 5 to 10 seconds. As the plasma gas, in the case of treating the wide bandgap semiconductor substrate, plasma from oxygen gas can be used when the surface is to be oxidized, whereas hydrogen gas, argon gas, or a mixed gas thereof, or a mixed gas of hydrogen gas and helium gas can be used when the surface is not to be oxidized. In the case of treating the handle substrate, any of the gases may be adopted. This treatment oxidizes and removes organic matter at the surface of the wide bandgap semiconductor substrate and/or the handle substrate, and further increases OH groups at the surface to activate the surface.

While the four types of treatments are preferably applied to both the ion-implanted surface of the wide bandgap semiconductor substrate and the surface of the handle substrate to be bonded, the treatments may be applied to either one of the substrates.

Next, the bonded substrates 6 obtained are subjected to a heat treatment at 150° C. or more and 400° C. or less. The reason why the heat treatment is carried out is that crystal defects are prevented from being introduced by sliding of the bonded surfaces 9 due to a sharp rise in temperature when the bonded surfaces 9 are subjected to high temperatures in a subsequent step of visible light irradiation. The reason of the temperature of 150° C. or more and 400° C. or less is that the bonding strength may fail to be increased in the case of less than 150° C., whereas there is a possibility that the bonded substrates will be destroyed in the case of greater than 400° C.

Experiments and considerations made by the inventors have shown that the appropriate temperature is 150° C. or more and 400° C. or less when the handle substrate 3 is quartz or glass, and 150° C. or more and 350° C. or less when the handle substrate 3 is sapphire. These temperature ranges vary depending on the substrate. The heat treatment may be carried out in two or more steps by varying the temperature in the appropriate temperature range.

The heat treatment time is preferably 12 hours to 72 hours, depending on the temperature to some extent.

Subsequently, the bonded substrates 6 are cooled to room temperature, and anneal is applied in such a way that the ion-implanted layer 2 of the wide bandgap semiconductor substrate 1 is subjected to irradiation of visible light for a short period of time from the semiconductor substrate 1 side or the handle substrate 3 side.

In this specification, the term "visible light" refers to light with a maximum wavelength in a wavelength region of 450 to 700 nm, and a wavelength for which the wide bandgap semiconductor substrate 1 has a high transmission is selected appropriately as the wavelength. The visible light may be any of coherent light and incoherent light.

Typically, the semiconductor substrate 1 is transparent and has an extremely low absorption coefficient in this wavelength region. However, the hydrogen ion-implanted place absorbs light in this wavelength region to accelerate a chemical reaction internally, thereby resulting in embrittlement at the interface of the ion-implanted layer 2 without the entire surface of the substrate being overheating. Consequently, the wide bandgap semiconductor film 4 is transferred to the handle substrate 3, and thus allowing a bonded wafer 8 to be formed.

A laser which can be adopted in this wavelength region of visible light includes, for example, a green laser with a wavelength of 532 nm and a red laser with a wavelength of 633 nm, which are used for crystallization of amorphous silicon for liquid crystals, and a second harmonic wave (wavelength=532 nm) from a Nd:YAG laser, and a second harmonic wave (wavelength=532 nm) from a $YVO_4$ laser.

While the irradiation method in this case is not to be considered particularly limited, a method is desirable which can complete the treatment before the entire substrate has been heated, because warpage may destroy the substrate if the entire substrate has been heated.

While irradiation can be carried out from the semiconductor substrate 1 side as shown in FIG. 1 in the method according to the present invention, it is also possible to carry out irradiation from the handle substrate 3 side as shown in FIG. 2 when the handle substrate exhibits less energy loss of light in a visible light region (wavelength: 450 nm to 700 nm) until the light reaches the ion-implanted layer of the wide bandgap semiconductor substrate bonded and the handle substrate has a transmission of 70% or more for the visible light region. Such a handle substrate includes, for example, a substrate of quartz, glass, or sapphire.

On the other hand, when the handle substrate is composed of an opaque material such as silicon, it is essential that irradiation is carried out from the wide bandgap semiconductor substrate 1 side.

Most of the wavelength region of visible light is transmitted through the semiconductor substrate 1, and is absorbed only by the ion-implanted place. Thus, the entire transparent substrate is not heated, while energy can be given to only the place requiring energy (ion-implanted place), which is an ideal method. In this method, the ion-implanted place is subjected to sufficient embrittlement, and it is thus possible to transfer a film without imposing a burden on the substrate.

The concern in this case is that if the ion-implanted section is overheated, thermal detachment may be partially caused to produce a swelling defect referred to as blister. This defect is visually observed from the transparent substrate side of the bonded substrates 6. Once this blister initiates detachment, stress is localized in the bonded substrates 6 to cause destruction of the bonded substrates 6. Therefore, it is desirable to carry out laser irradiation without causing thermal detachment, or to apply a mechanical impact to an end of the bonded substrates 6 near the bonded surfaces 9 prior to laser irradiation so as to cause a thermal shock applied by the laser irradiation to fracture the ion-implanted interface from the end as the point of origin of the mechanical impact to the entire surface of the bonded substrates 6.

As a condition for the laser irradiation, experience shows that the irradiation energy per unit area is desirably 0.4 $J/cm^2$ to 1.6 $J/cm^2$ in the case of output of 50 W to 100 W and an oscillation frequency of 25 mJ@3 kHz. This is because there is a possibility that embrittlement will not be caused at the ion-implanted interface if the irradiation energy is less than 0.4 $J/cm^2$, whereas there is a possibility that excessive embrittlement will break the substrate if the irradiation energy is greater than 1.6 $J/cm^2$. It is difficult to define the irradiation in terms of time since the wafer is scanned with spot-like laser light. The irradiation energy after the treatment desirably falls within the range mentioned above.

As the method for visible light irradiation, RTA or the like for use in semiconductor processes is also useful. The RTA is a great method which allows rapid increase and decrease in temperature from 50° C./second to 150° C./second and allows the process to be completed before heating up the entire substrate. In this case, it is important to overheat only the vicinity of the ion-implanted interface without causing thermal detachment. The heat source for typical use in RTA is a halogen lamp, which is thus suitable as a source for visible light irradiation.

It is to be noted that a xenon flash lamp and the like can also be applied as visible light. In the case of using light from a xenon lamp, irradiation can be carried out through a wavelength filter for blocking light outside the visible light range. In addition, a filter or the like for blocking wavelengths other than the wavelength range of visible light, which is transparent to the wide bandgap substrate, is also effective for the stabilization of the process. In order to prevent the blister described above from being caused, the entire surface of the bonded substrates is desirably irradiated simultaneously with light from the xenon lamp. The simultaneous irradiation makes it easy to prevent stress of the bonded substrates from being localized and prevent the bonded substrates from being destroyed. Therefore, it is desirable to carry out xenon lamp light irradiation in a manner of not causing thermal detachment, or to apply a mechanical impact to an end of the bonded substrates 6 near the bonded surfaces 9 prior to xenon lamp light irradiation so as to cause a thermal shock applied by the xenon lamp light irradiation to fracture the ion-implanted surface from the end as the point of origin of the mechanical impact to the entire surface of the bonded substrates 6.

After the laser light irradiation, RTA treatment, or flash lamp irradiation, detachment may be carried out by giving a mechanical impact to the interface of the ion-implanted layer 5 if it is not seen that the wide bandgap semiconductor film is transferred to the handle substrate.

In order to apply a mechanical impact to the interface of the ion-implanted layer, for example, a jet of a fluid such as a gas or a liquid may be sprayed continuously or intermittently from a side of the bonded wafer, or a detacher may be used, and the method for giving a mechanical impact is not particularly limited as long as the method can provide the impact which causes mechanical detachment.

The detacher is an apparatus which can apply a mechanical impact from the side surface of the hydrogen ion-implanted layer in the bonded substrates 6 subjected to a heat treatment at a temperature of 150° C. or more and 400° C. or less. The detacher preferably has a sharp part applicable to the side surface of the hydrogen ion-implanted layer, and movable along the ion-implanted layer. The detacher may preferably include a scissors-like acute-angled tool and a device with a scissors-like acute-angled blade. The material of the detacher may include plastic (for example, polyether ether ketone), zirconia, silicon, and diamond. Metals can also be included when contamination is not an issue. When the contamination is an issue, plastic may be used. In addition, a blade of scissors or the like may be used as a wedge-shaped acute-angled tool.

The detachment step provides the bonded wafer 8 with the wide bandgap semiconductor film 4 formed on the handle substrate 3.

The wide bandgap semiconductor film 4 can typically have a thickness of 50 nm to 2000 nm.

The ion implantation and the surface activation treatment will be described below.

The method for manufacturing a bonded wafer according to the present invention comprises, prior to a step of bonding the wide bandgap semiconductor substrate 1 and the handle substrate 3, a step of implanting ions from one surface 5 of the wide bandgap semiconductor substrate 1 to form the ion-implanted layer 2. In this case, a predetermined dose of hydrogen ions ($H^+$) or hydrogen molecule ions ($H_2^+$) is implanted with such an implantation energy that can form the ion-implanted layer 2 at a desired depth from the surface. As a condition in this case, for example, the implantation energy can be 50 to 100 KeV.

The dose amount of hydrogen ions ($H^+$) implanted into the wide bandgap semiconductor substrate 1 is preferably $5.0 \times 10^{16}$ atom/cm$^2$ to $3.0 \times 10^{17}$ atom/cm$^2$. The embrittlement of the interface may not happen if the dose amount is less than $5.0 \times 10^{16}$ atom/cm$^2$, whereas air bubbles may be caused during the heat treatment after the bonding to result in defective transfer if the dose amount is greater than $2.0 \times 10^{17}$ atom/cm$^2$.

In the case of using hydrogen molecule ions ($H_2^+$) as implanted ions, the dose amount thereof is preferably $2.5 \times 10^{15}$ atoms/cm$^2$ to $1.5 \times 10^{17}$ atoms/cm$^2$. The embrittlement of the interface may not happen if the dose amount is less than $2.5 \times 10^{15}$ atoms/cm$^2$, whereas air bubbles may be caused during the heat treatment after the bonding to result in defective transfer if the dose amount is greater than $1.0 \times 10^{17}$ atoms/cm$^2$.

In addition, when the implantation of hydrogen ions or hydrogen molecule ions is carried out through an insulating film such as a silicon oxide film about several nm to 500 nm which is formed in advance on the surface of the wide bandgap semiconductor substrate 1, implanted ion channeling can be suppressed.

The method for manufacturing a bonded wafer according to the present invention comprises, after the ion implantation prior to bonding the wide bandgap semiconductor substrate 1 and the handle substrate 3, a step of applying a surface activation treatment to the ion-implanted surface 5 of the wide bandgap semiconductor substrate 1 and/or the surface of the handle substrate 3. Examples of the method for the surface activation treatment include a plasma treatment, an ozone treatment, and the like.

In the case of a plasma treatment, the surface may be subjected to the plasma treatment by placing, in a vacuum chamber, the wide bandgap semiconductor substrate and/or handle substrate subjected to RCA cleaning or the like, introducing a plasma gas under reduced pressure, and then exposing the substrate(s) to a high-frequency plasma about 100 W for about 5 to 10 seconds. As the plasma gas, in the case of treating the wide bandgap semiconductor substrate, plasma from oxygen gas can be used when the surface is to be oxidized, whereas hydrogen gas, argon gas, or a mixed gas thereof, or a mixed gas of hydrogen gas and helium gas can be used when the surface is not to be oxidized. In the case of treating the handle substrate, any of the gases may be adopted.

This treatment with plasma oxidizes and removes organic matter at the surface of the wide bandgap semiconductor substrate and/or the surface of the handle substrate, and further increases OH groups at the surface(s) for activation. While the treatment is preferably applied to both the ion-implanted surface of the wide bandgap semiconductor substrate and the surface of the handle substrate to be bonded, the treatment may be applied to either one of the surfaces.

In the case of an ozone treatment, the surface may be subjected to the ozone treatment by placing, in a chamber with the air introduced therein, the wide bandgap semiconductor substrate and/or handle substrate subjected to RCA cleaning or the like, introducing a plasma gas such as a nitrogen gas or an argon gas, and then generating a high-frequency plasma to convert oxygen in the air to ozone. One or both of the plasma treatment and the ozone treatment can be carried out.

The present invention is also directed to the bonded wafer obtained in accordance with the method for manufacturing a bonded wafer. Examples of the application of the bonded wafer include the application for manufacturing substrates for electro-optical devices such as liquid crystal devices, and substrates for power semiconductors and short wavelength lasers.

EXAMPLES

Example 1

Implantation of $H_2^+$ ions into a GaN substrate of 50 mm in diameter was carried out in a dose amount of $1.35 \times 10^{17}$ atoms/cm$^2$ at an accelerating voltage of 75 KeV. Subsequently, a silicon substrate of 50 mm in diameter to serve as a handle substrate was prepared, and the both substrates were subjected to an ozone water treatment, a UV ozone treatment, an ion beam treatment, or a plasma activation treatment. The substrates were bonded to each other at room temperature, subjected to a heat treatment at 250° C. for 24 hours, and then irradiation with a laser of 532 nm from the transparent GaN substrate side. The irradiation energy was about 0.5 J/cm$^2$. After the irradiation, the application of a light mechanical impact to the bonded surfaces succeeded in transfer of a film of the GaN onto the silicon substrate. The thickness of the GaN transferred in this case was 290 nm.

This has revealed that the quality of the film transferred is independent of the type of the activation.

Example 2

Implantation of $H_2^+$ ions into a GaN substrate of 50 mm in diameter was carried out in a dose amount of $1.35\times10^{17}$ atoms/cm$^2$ at an accelerating voltage of 75 KeV. Subsequently, a silicon substrate of 50 mm in diameter to serve as a handle substrate was prepared, and the both substrates were subjected to an ion beam activation treatment. The substrates were bonded to each other at room temperature, and subjected to a heat treatment at 250° C. for 24 hours. After preparing three sets of substrates of the same kind in total, visible light irradiation was carried out from the transparent substrate side (quartz side) with the use of a green laser (wavelength: 532 nm), RTA, or a flash lamp.

In the condition for laser irradiation in this case, the oscillation frequency was 25 mJ@3 kHz with an output of 75 W. The entire surface of the substrate was subjected to irradiation with 1.2 J/cm$^2$.

In the case of RTA, a pyrometer was placed to observe the bonded surfaces for temperature from the GaN side. In this case, the temperature near the bonded surfaces can be observed.

The temperature was risen to 350° C. (reading of the pyrometer) at a rate of 50° C./second, and the power was cut for cooling the substrates as soon as the temperature reached 350° C.

In the case of a flash lamp, irradiation was carried out with a pulse width of 1 m second (millisecond). After the irradiation, the application of a light mechanical impact to the bonded surfaces succeeded in transfer of a film of the GaN to the silicon substrate. The thickness of the GaN transferred in this case was 750 nm. The visual observation of the three samples found no significant difference. This has revealed that the quality of the film transferred is independent of the type of the visible light irradiation.

Comparative Example 1

Implantation of $H_2^+$ ions into a GaN substrate of 50 mm in diameter was carried out in a dose amount of $1.35\times10^{17}$ atoms/cm$^2$ at an accelerating voltage of 75 KeV. Subsequently, a silicon substrate of 50 mm in diameter to serve as a handle substrate was prepared, and the both substrates were subjected to an ion beam treatment. The substrates were bonded to each other at 200° C., subjected to a heat treatment at 250° C. for 24 hours, and then irradiation with a laser of 532 nm on a hot plate at 200° C. from the transparent GaN substrate side. The irradiation energy was about 0.5 J/cm$^2$.

After the irradiation, the application of a light mechanical impact to the bonded surfaces succeeded in transfer of a film of the GaN onto the silicon substrate. The thickness of the GaN transferred in this case was 290 nm.

Comparative Example 2

Implantation of $H^+$ ions into a GaN substrate of 50 mm in diameter was carried out in a dose amount of $1.35\times10^{17}$ atoms/cm$^2$ at an accelerating voltage of 75 KeV. Subsequently, a silicon substrate of 50 mm in diameter to serve as a handle substrate was prepared, and the both substrates were subjected to an ion beam treatment. The substrates were bonded to each other at 200° C., subjected to a heat treatment at 250° C. for 24 hours, and then irradiation with a laser of 532 nm on a hot plate at 250° C. from the transparent GaN substrate side. The irradiation energy was about 0.5 J/cm$^2$. After the irradiation, the application of a light mechanical impact to the bonded surfaces succeeded in transfer of a film of the GaN onto the silicon substrate. The thickness of the GaN transferred in this case was 290 nm. From Comparative Examples 1 and 2, it is believed that the temperature for bonding and the temperature for irradiation have a high degree of freedom.

Example 3

Implantation of $H^+$ ions into a ZnO substrate of 50 mm in diameter was carried out in a dose amount of $9.5\times10^{16}$ atoms/cm$^2$ at an accelerating voltage of 80 KeV. Subsequently, a silicon substrate of 50 mm in diameter to serve as a handle substrate was prepared, and the both substrates were subjected to a plasma activation treatment. The substrates were bonded to each other at room temperature, subjected to a heat treatment at 250° C. for 24 hours, and then irradiation with a Xe flash lamp from the ZnO substrate side. The pulse width was about 1 millisecond. After the irradiation, the application of a light mechanical impact to the bonded surfaces succeeded in transfer of a film of the ZnO onto the silicon substrate. The thickness of the ZnO transferred in this case was 550 nm.

Example 4

Implantation of $H_2^+$ ions into a GaN substrate of 50 mm in diameter was carried out in a dose amount of $1.35\times10^{17}$ atoms/cm$^2$ at an accelerating voltage of 75 KeV. Subsequently, a sapphire substrate of 50 mm in diameter to serve as a handle substrate was prepared, and the both substrates were subjected to a plasma activation treatment. The substrates were bonded to each other at room temperature, subjected to a heat treatment at 150° C. for 24 hours and at 250° C. for 24 hours, and then irradiation with a Xe flash lamp from the sapphire substrate side. The pulse width was about 1 millisecond. After the irradiation, the application of a light mechanical impact to the bonded surfaces succeeded in transfer of a film of the GaN onto the sapphire substrate. The thickness of the GaN transferred in this case was 290 nm.

The invention claimed is:

1. A method for manufacturing a bonded wafer by forming a wide bandgap semiconductor film on a surface of a handle substrate, the method comprising the steps of:
    implanting ions from a surface of a wide bandgap semiconductor substrate having a bandgap of 2.8 eV or more to form an ion-implanted layer;
    applying a surface activation treatment to at least one of the surface of the handle substrate and the ion-implanted surface of the wide bandgap semiconductor substrate;
    bonding the surface of the wide bandgap semiconductor substrate and the surface of the handle substrate to obtain the bonded substrates;
    applying a heat treatment at 150° C. or more and 400° C. or less to the bonded substrates; and
    subjecting the ion-implanted layer of the wide bandgap semiconductor substrate to irradiation of visible light from the semiconductor substrate side of the bonded substrates to embrittle an interface of the ion-implanted layer and transfer the wide bandgap semiconductor film onto the handle substrate.

2. A method for manufacturing a bonded wafer by forming a wide bandgap semiconductor film on a surface of a handle substrate, the method comprising the steps of:

implanting ions from a surface of a wide bandgap semiconductor substrate having a bandgap of 2.8 eV or more to form an ion-implanted layer;

applying a surface activation treatment to at least one of the surface of the handle substrate and the ion-implanted surface of the wide bandgap semiconductor substrate;

bonding the surface of the wide bandgap semiconductor substrate and the surface of the handle substrate to obtain the bonded substrates;

applying a heat treatment at 150° C. or more and 400° C. or less to the bonded substrates; and subjecting the ion-implanted layer of the wide bandgap semiconductor substrate to irradiation of visible light from the handle substrate side of the bonded substrates to embrittle an interface of the ion-implanted layer and transfer a wide bandgap semiconductor film onto the handle substrate.

3. The method for manufacturing a bonded wafer according to claim 1, wherein the surface activation is carried out by any one or combination of an ozone water treatment, a UV ozone treatment, an ion beam treatment, and a plasma treatment.

4. The method for manufacturing a bonded wafer according to claim 1, further comprising the step of applying, after the irradiation of visible light, a mechanical impact to the interface of the ion-implanted layer to detach the semiconductor film along the interface.

5. The method for manufacturing a bonded wafer according to claim 1, wherein the wide bandgap semiconductor substrate is a substrate of any one selected from the group consisting of silicon carbide, gallium nitride, zinc oxide, diamond, and aluminum nitride.

6. The method for manufacturing a bonded wafer according to claim 5, wherein the wide bandgap semiconductor substrate is a substrate of any one selected from the group consisting of silicon carbide, gallium nitride, zinc oxide, diamond, and aluminum nitride, each having an $SiO_2$ film formed thereon.

7. The method for manufacturing a bonded wafer according to claim 1, wherein the visible light is laser light or light from a xenon flash lamp.

8. The method for manufacturing a bonded wafer according to claim 1, wherein subjecting to the irradiation of visible light comprises RTA (Rapid Thermal Anneal) including spike anneal.

9. The method for manufacturing a bonded wafer according to claim 1, wherein the handle substrate is a substrate of any one selected from the group consisting of silicon, silicon having an oxide film formed thereon, alumina, non-single crystalline aluminum nitride, and silicon carbide.

10. The method for manufacturing a bonded wafer according to claim 2, wherein the handle substrate is a substrate of any one selected from the group consisting of glass, quartz, and sapphire.

11. The method for manufacturing a bonded wafer according to claim 1, wherein the implanted ions are hydrogen atom ions ($H^+$), and the dose amount thereof is $3.0\times10^{17}$ atoms/cm$^2$ or more and $2\times10^{17}$ atoms/cm$^2$ or less.

12. The method for manufacturing a bonded wafer according to claim 1, wherein the implanted ions are hydrogen molecule ions ($H_2^+$), and the dose amount thereof is $1.5\times10^{17}$ atoms/cm$^2$ or more and $1\times10^{17}$ atoms/cm$^2$ or less.

13. A bonded wafer obtained in accordance with the manufacturing method according to claim 1.

14. The method for manufacturing a bonded wafer according to claim 2, wherein the surface activation is carried out by any one or combination of an ozone water treatment, a UV ozone treatment, an ion beam treatment, and a plasma treatment.

15. The method for manufacturing a bonded wafer according to claim 2, wherein the wide bandgap semiconductor substrate is a substrate of any one selected from the group consisting of silicon carbide, gallium nitride, zinc oxide, diamond, and aluminum nitride, each having an $SiO_2$ film formed thereon.

16. The method for manufacturing a bonded wafer according to claim 2, wherein the visible light is laser light or light from a xenon flash lamp.

17. The method for manufacturing a bonded wafer according to claim 2, wherein subjecting to the irradiation of visible light comprises RTA (Rapid Thermal Anneal) including spike anneal.

18. The method for manufacturing a bonded wafer according to claim 2, wherein the handle substrate is a substrate of any one selected from the group consisting of glass, quartz, and sapphire.

19. The method for manufacturing a bonded wafer according to claim 2, wherein the implanted ions are hydrogen atom ions ($H^+$), and the dose amount thereof is $3.0\times10^{17}$ atoms/cm$^2$ or more and $2\times10^{17}$ atoms/cm$^2$ or less.

20. The method for manufacturing a bonded wafer according to claim 2, wherein the implanted ions are hydrogen molecule ions ($H_2^+$), and the dose amount thereof is $1.5\times10^{17}$ atoms/cm$^2$ or more and $1\times10^{17}$ atoms/cm$^2$ or less.

* * * * *